(12) United States Patent
Benzing et al.

(10) Patent No.: US 6,669,253 B2
(45) Date of Patent: Dec. 30, 2003

(54) WAFER BOAT AND BOAT HOLDER

(76) Inventors: David W. Benzing, 1203 Foxworthy Ave., San Jose, CA (US) 95118-1212; Christopher A. Luebker, 839 Mullrany Dr., Coppell, TX (US) 75019

(*) Notice: Subject to any disclaimer, the term of this patent is extended or adjusted under 35 U.S.C. 154(b) by 0 days.

(21) Appl. No.: 09/740,677

(22) Filed: Dec. 18, 2000

(65) Prior Publication Data

US 2002/0076316 A1 Jun. 20, 2002

(51) Int. Cl.[7] .................. B65G 49/07; B65D 25/28; B05C 13/02
(52) U.S. Cl. ............... 294/15; 294/16; 294/27.1; 206/711; 206/832; 118/500; 118/728
(58) Field of Search .................. 294/1.1, 15, 16, 294/27.1, 26, 33; 414/938, 940; 206/454, 711, 832, 833; 432/253, 258; 118/500, 728, 729

(56) References Cited

U.S. PATENT DOCUMENTS

| | | | | |
|---|---|---|---|---|
| 3,923,156 A | * | 12/1975 | Wallstad | 206/833 |
| 3,939,973 A | * | 2/1976 | Wallestad | 206/454 |
| 4,053,294 A | * | 10/1977 | Sullivan | 432/258 |
| 4,195,871 A | * | 4/1980 | Chilton et al. | 294/16 |
| 4,515,104 A | * | 5/1985 | Lee | 432/253 |
| 4,520,934 A | * | 6/1985 | Aigo | 432/258 |
| 4,555,024 A | * | 11/1985 | Voss et al. | 206/454 |
| 4,572,101 A | * | 2/1986 | Lee | 206/833 |
| 4,595,222 A | * | 6/1986 | Schumacher | 294/16 |
| 4,653,636 A | * | 3/1987 | Armstrong | 206/832 |
| 4,676,008 A | * | 6/1987 | Armstrong | 206/454 |
| 4,684,021 A | * | 8/1987 | Niebling et al. | 206/454 |
| 4,722,659 A | * | 2/1988 | Hoyt, III et al. | 414/940 |
| 4,728,246 A | * | 3/1988 | Mello | 206/833 |
| 4,793,488 A | * | 12/1988 | Mortensen | 206/454 |
| 4,833,306 A | * | 5/1989 | Milbrett | 414/940 |
| 5,253,755 A | * | 10/1993 | Maenke | 206/454 |
| 5,364,144 A | * | 11/1994 | Satterfiled et al. | 206/454 |
| 5,370,142 A | * | 12/1994 | Nishi et al. | 206/454 |
| 5,390,811 A | * | 2/1995 | Ogino et al. | 206/445 |
| 5,555,981 A | * | 9/1996 | Gregerson | 206/711 |
| 5,628,604 A | * | 5/1997 | Murata et al. | 414/283 |
| 5,782,517 A | * | 7/1998 | Mckee, IV | 206/711 |
| 5,803,269 A | * | 9/1998 | Jacoby et al. | 206/454 |
| 6,003,674 A | * | 12/1999 | Brooks | 206/711 |
| 6,220,438 B1 | * | 4/2001 | Hirohata et al. | 206/711 |
| 6,230,891 B1 | * | 5/2001 | Usui et al. | 206/454 |
| 6,245,147 B1 | * | 6/2001 | Kobayashi | 206/833 |
| 6,247,597 B1 | * | 6/2001 | Sato | 414/940 |

FOREIGN PATENT DOCUMENTS

| | | | | |
|---|---|---|---|---|
| DE | 004037206 | * | 5/1992 | 414/940 |
| JP | 403094446 | * | 4/1991 | 414/938 |
| JP | 404144150 | * | 5/1992 | 414/940 |

* cited by examiner

Primary Examiner—Dean J. Kramer
Assistant Examiner—Paul T. Chin
(74) Attorney, Agent, or Firm—Robert O. Guillot; IPLO Intellectual Property Law Offices

(57) ABSTRACT

A wafer boat and boat handle are designed for automatic interlocking engagement and release upon manipulation by a user. The boat includes a side rail with a lip for engagement within a slot formed in the handle, and a handle cam activating contact surface for contacting a gripping block member of the handle. The handle includes at least one boat holding block with a boat lip holding slot therewithin. The handle also includes at least one boat gripping block that is rotatably engaged with the holding block, and which includes a frontwardly projecting rail gripping flange. When the boat lip is brought into the holding block slot, the gripping block rotates and the flange is brought over the top of the rail. The boat rail is thereby held between the slot and the flange of the handle, such that the boat may be lifted and moved.

10 Claims, 9 Drawing Sheets

WAFER BOAT AND BOAT HOLDER

BACKGROUND OF THE INVENTION

1. Field of the Invention

The present invention relates generally to devices for holding and transporting wafers, such as are utilized in semiconductor manufacturing processes, and more particularly to wafer holding devices, termed "boats", and boat gripping and holding devices, termed "boat handles".

2. Description of the Prior Art

Manufacturing processes for fabricating thin film devices on wafers, such as are conducted in the semiconductor industry, involve numerous process steps in which thin films are deposited onto silicon wafers or these films are etched into specific patterns. In some of these process steps, a plurality of wafers are typically held in a device, termed a boat. One or more boats are then loaded into and subsequently unloaded from the processing system. The use of boats serves to position the wafers within the processing system, to ease loading and unloading of wafers, and to minimize the handling of individual wafers. Movement of the boats can require that the boats be physically gripped, lifted and transported from one process station to another. only made between the central section of the paddle and the flat bottom of the boat. In most such processes, several boats are placed on the paddle for processing.

It is vitally important in the fabrication process that the boats be securely gripped when they are transported to and from the paddle. Dropping the boat and or its wafer cargo most often results in broken or damaged wafers and significant financial loss. Therefore, a need exists for a boat handling device that automatically and securely grips the boats for transportation during the fabrication process.

SUMMARY OF THE INVENTION

The boat and boat handle of the present invention are cooperatively designed for automatic interlocking engagement and release upon manipulation by a user. The boat includes a side rail that is designed with a lip portion for engagement within a slot formed in the handle, and a handle cam actuating contact surface for contacting a gripping block member of the handle. The handle includes at least one boat holding block that is formed with a boat lip holding slot therewithin. The handle also includes at least one boat gripping block that is rotatably engaged with the holding block, and which includes a frontwardly projecting rail gripping flange. When the boat lip is brought into the holding block slot, the gripping block is caused to rotate such that the flange is brought over the top of the rail. The boat rail is thereby held between the slot and the flange of the handle, such that the boat may be lifted and moved through movement of the handle. When the boat is set down, the gripping block member automatically rotates rearwardly, such that the flange no longer projects over the top of the boat rail, and the handle is thereby released from engagement with the boat rail.

It is an advantage of the present invention that a wafer boat and a wafer boat handle are created that automatically engage and disengage each other through movement of the handle.

It is an advantage of the wafer boat of the present invention that it is designed to automatically engage and disengage with a boat handle.

These and other features and advantages will become apparent to those skilled in the art after having read the following detailed description that make reference to the several figures of the drawings.

IN THE DRAWINGS

Figure 6:
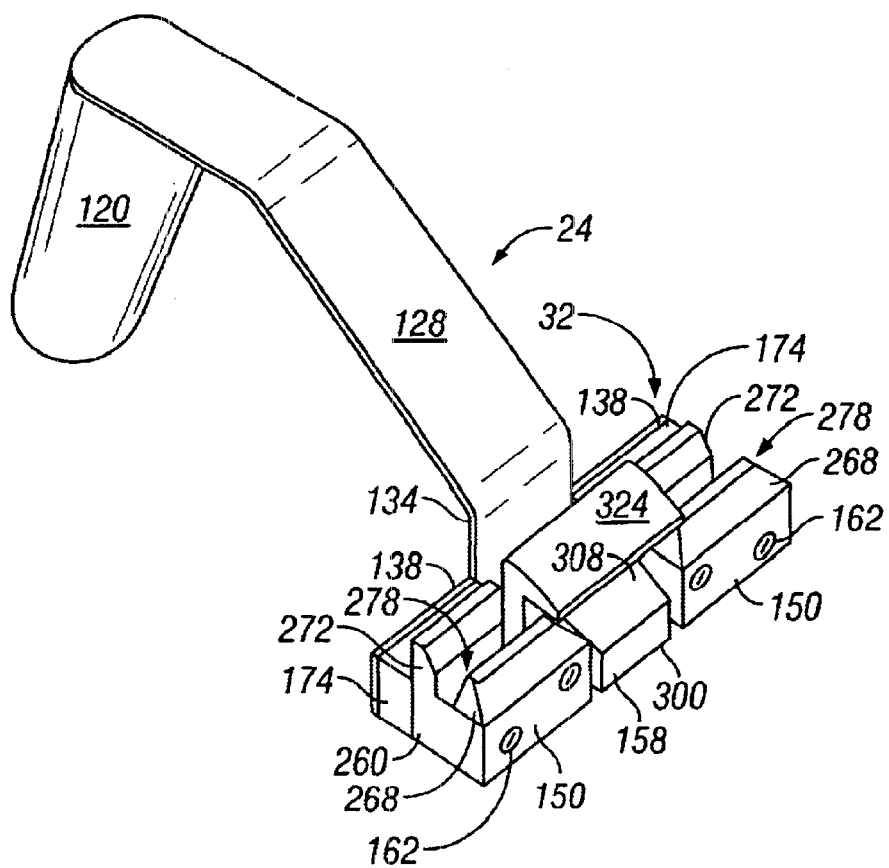
Figure 7:
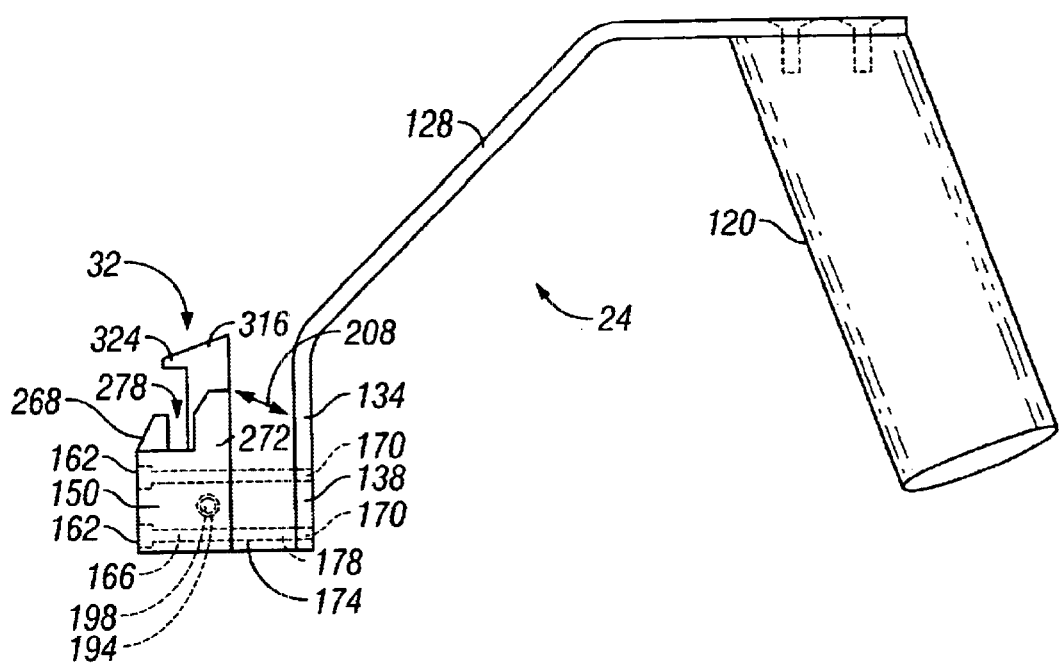
Figure 8:
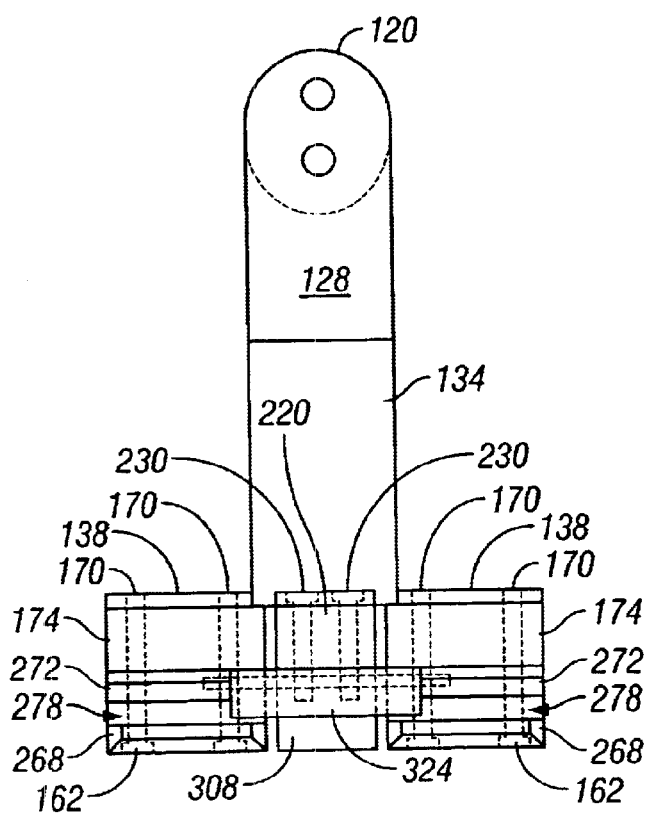
Figure 9:
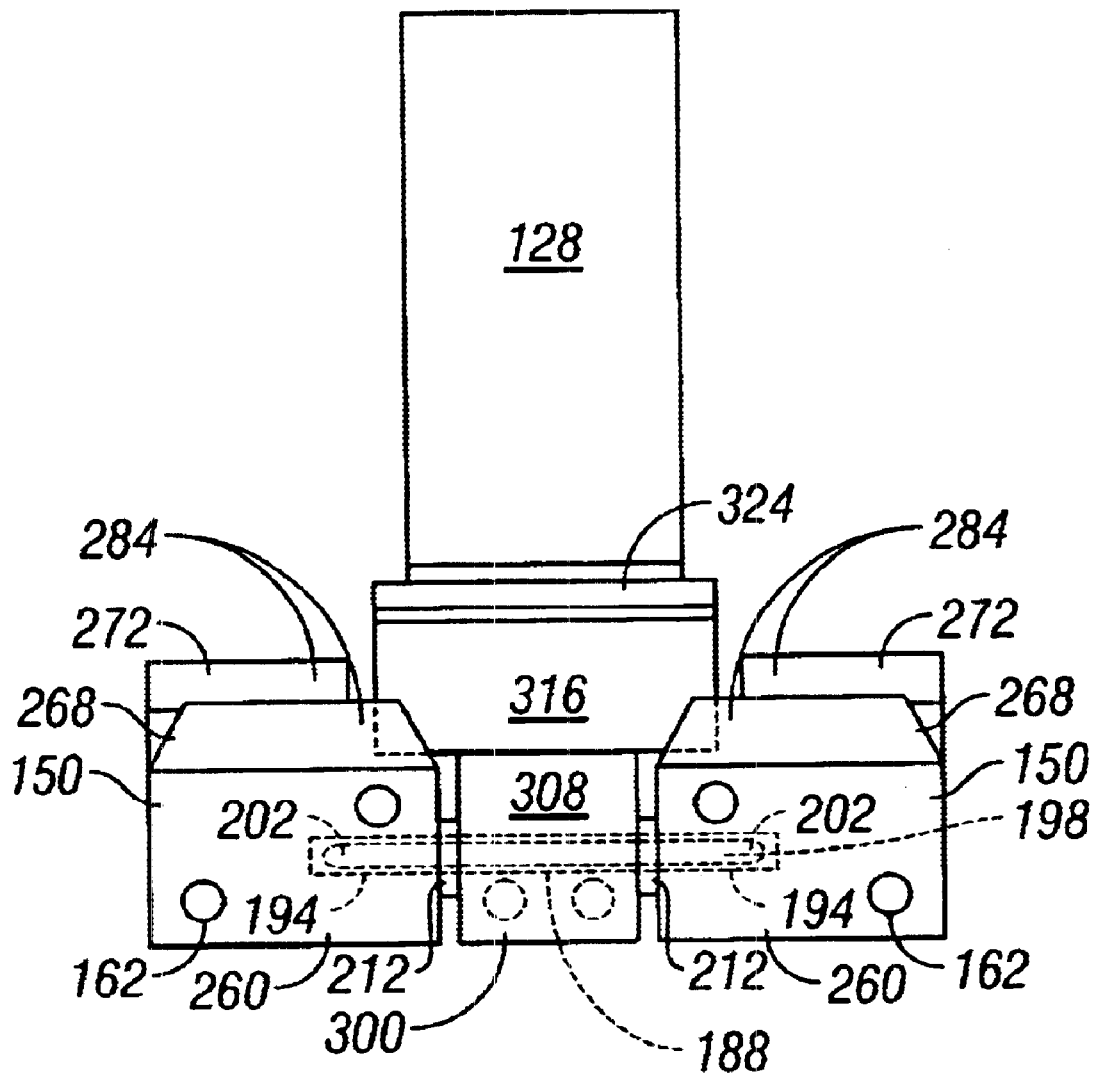
Figure 10:
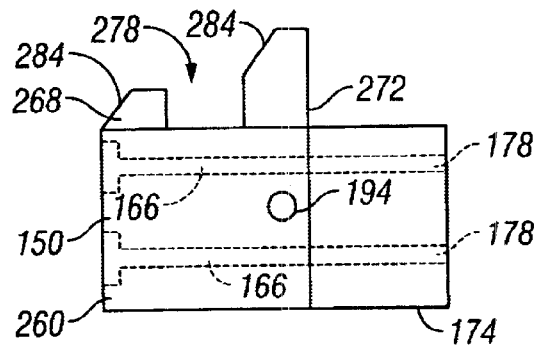
Figure 11:
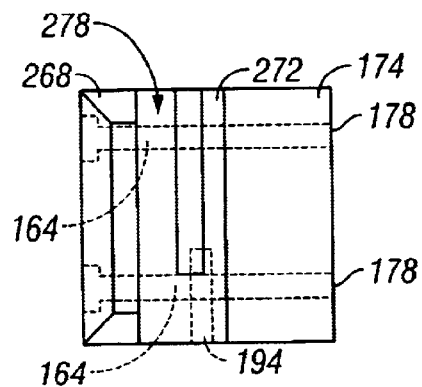
Figure 12:
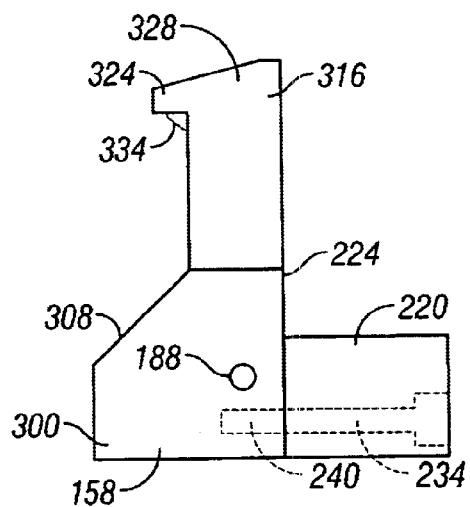
Figure 13:
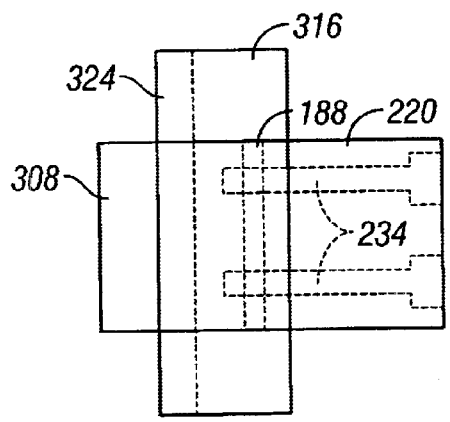
Figure 14:
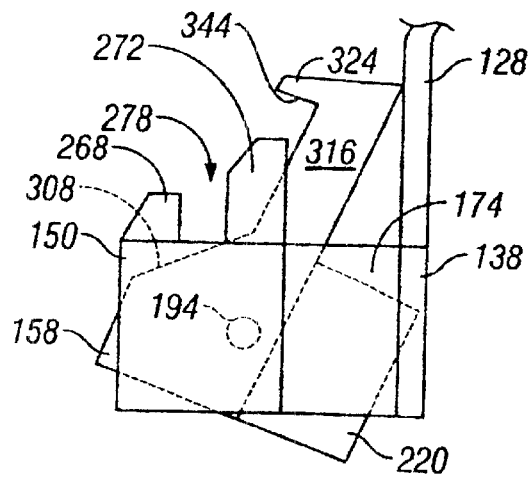
Figure 15:
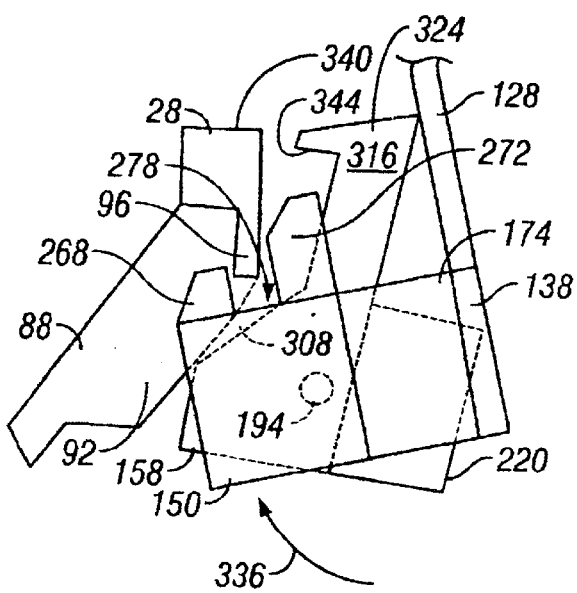
Figure 16:
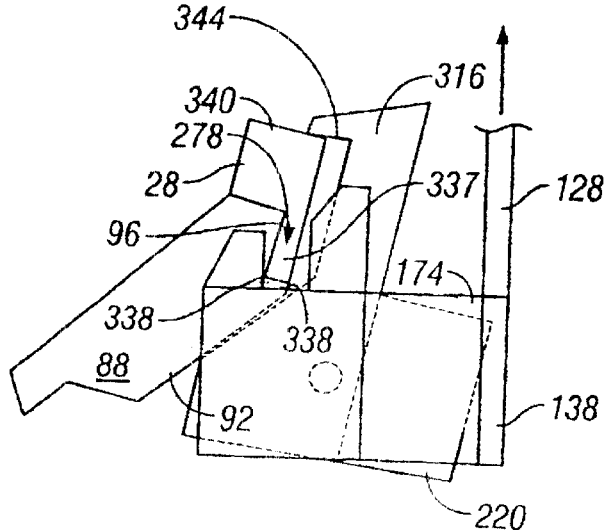
Figure 17:
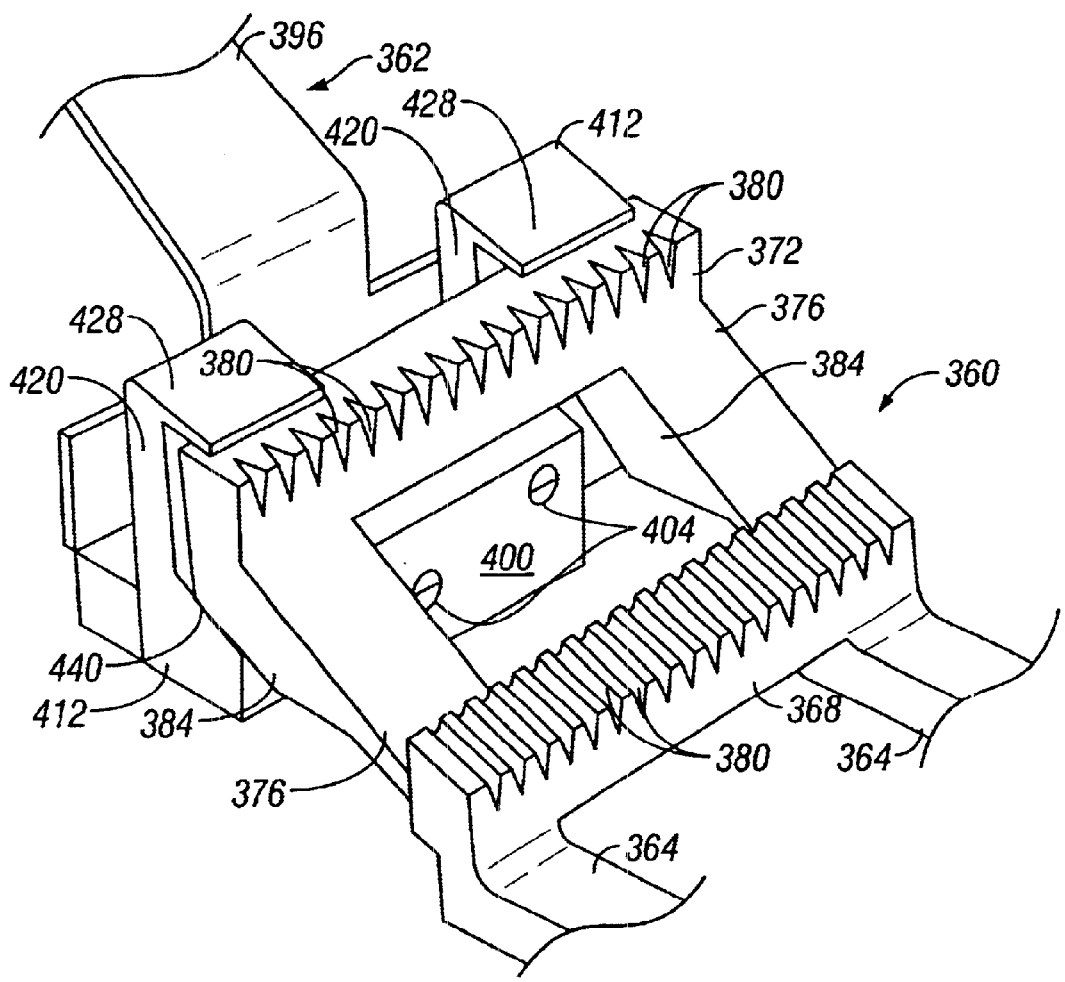

FIG. 6. is a perspective view of a boat handle of the present invention;

FIG. 7. is a side elevational view of the boat handle depicted in FIG. 6;

FIG. 8 is a top plan view of the boat handle;

FIG. 9 is a front elevational view of the boat handle;

FIG. 10 is a side elevational view of a boat lip holding block of the boat handle of the present invention;

FIG. 11 is a top plan view of the holding block depicted in FIG. 10;

FIG. 12 is a side elevational view of a boat rail gripping block of the present invention;

FIG. 13 is a top plan view of the boat rail gripping block depicted in FIG. 12;

FIG. 14 is an expanded side elevational view depicting the boat handle of the present invention in an orientation for gripping a boat rail;

FIG. 15 is a side elevational view depicting a boat rail being engaged by the handle depicted in FIG. 14;

FIG. 16 is a side elevational view depicting a boat rail that is held within the boat handle of the present invention; and FIG. 17 is a broken perspective view depicting an alternative boat of the present invention that is held in an alternative handle of the present invention.

DETAILED DESCRIPTION OF THE PREFERRED EMBODIMENTS

Figure 1:
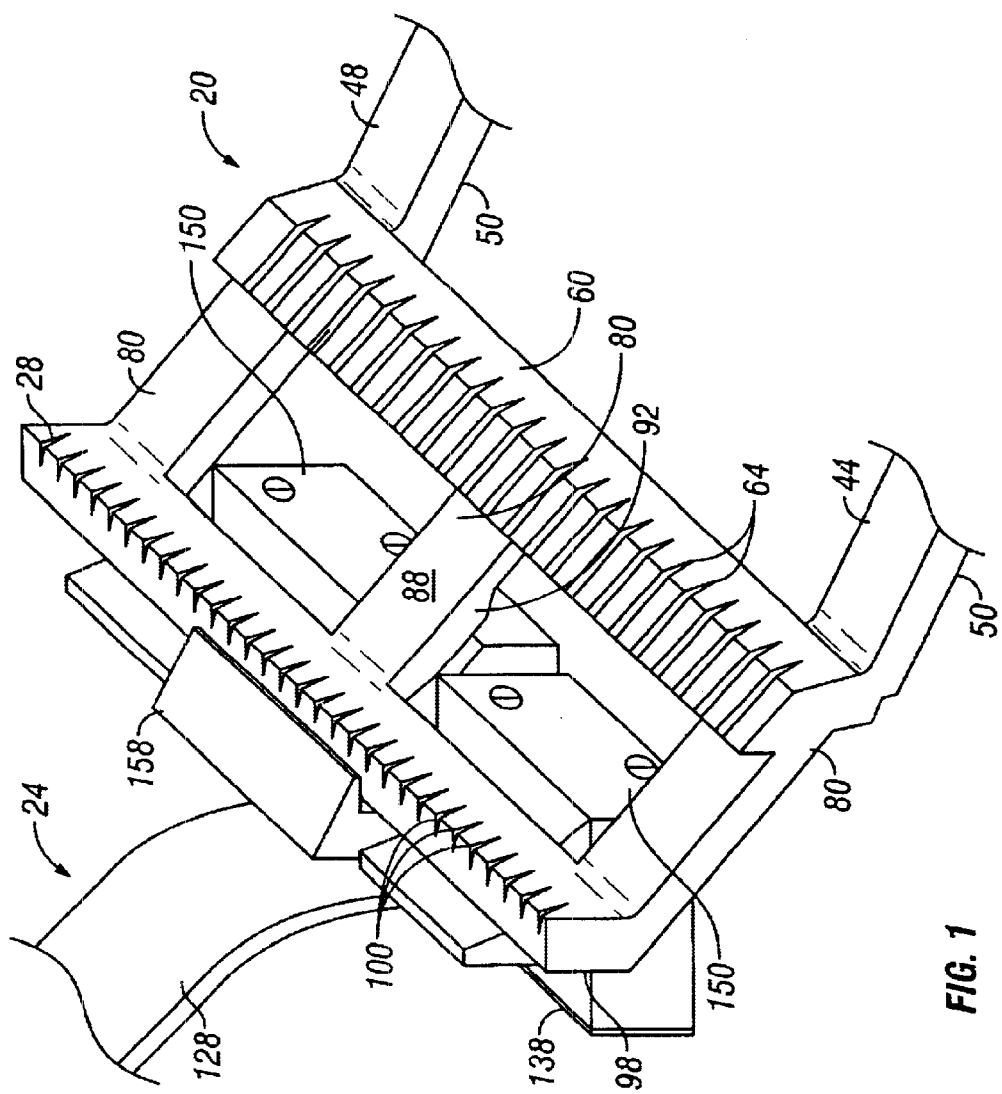
FIG. 1 is a broken perspective view depicting a boat of the present invention that is held by a handle of the present invention.
Figure 2:
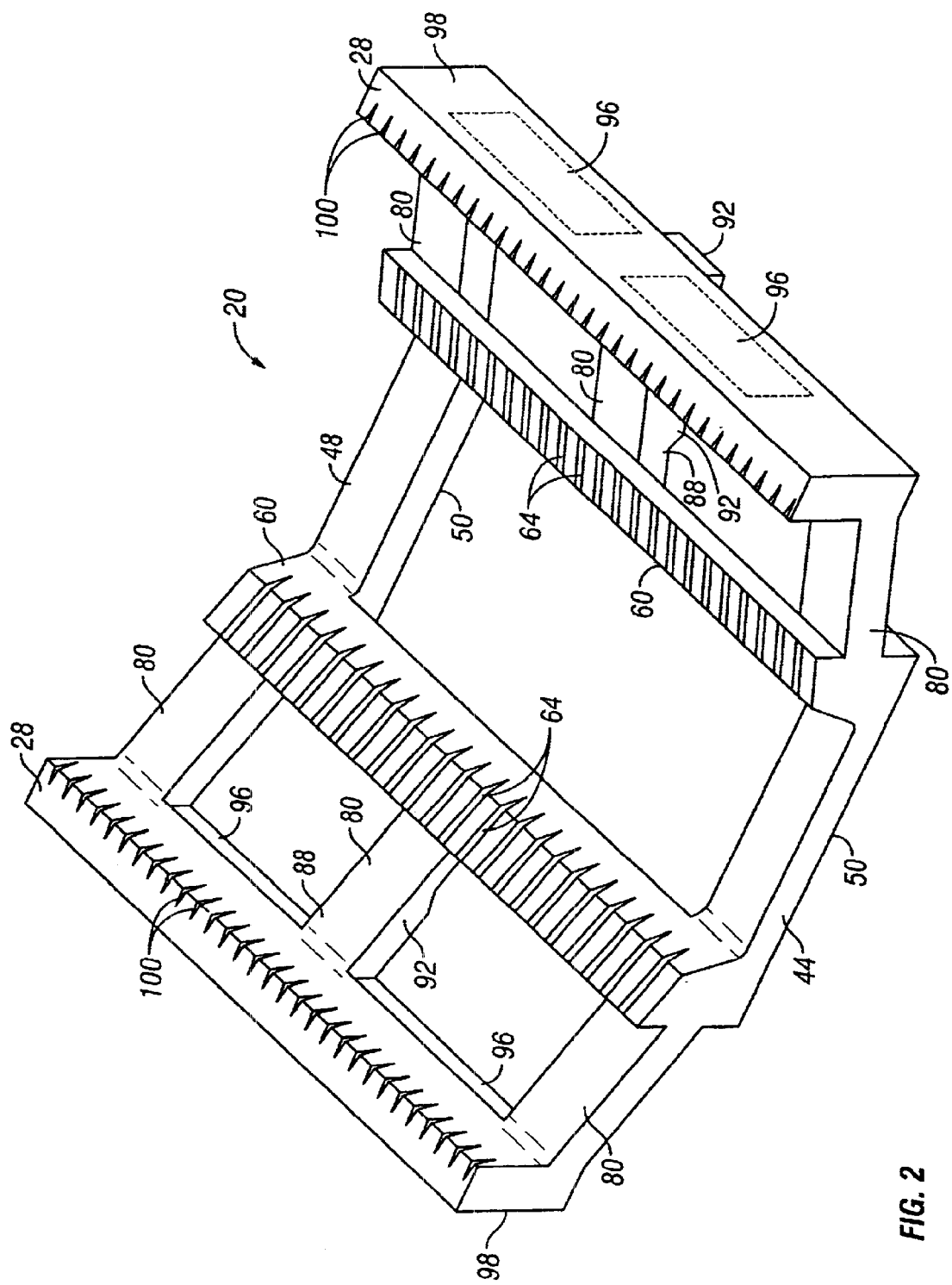
FIG. 2 is a perspective view of a boat of the present invention.

The boat 20 and boat handle 24 of the present invention are depicted in perspective views in FIGS. 1, 2 and 6, wherein FIG. 1 is a broken perspective view depicting the boat engaged with the boat handle, FIG. 2 depicts the boat 20 and FIG. 6 depicts the boat handle. Briefly, as depicted in FIG. 1, the boat 20 is formed with a side rail 28 that is releasably engageable by the boat rail engagement mechanism 32 of the handle 24. A detailed description of the boat 20 is next provided, followed by a detailed description of the boat handle 24, following which the self-locking mechanism of the present invention will be described.

Figure 3:
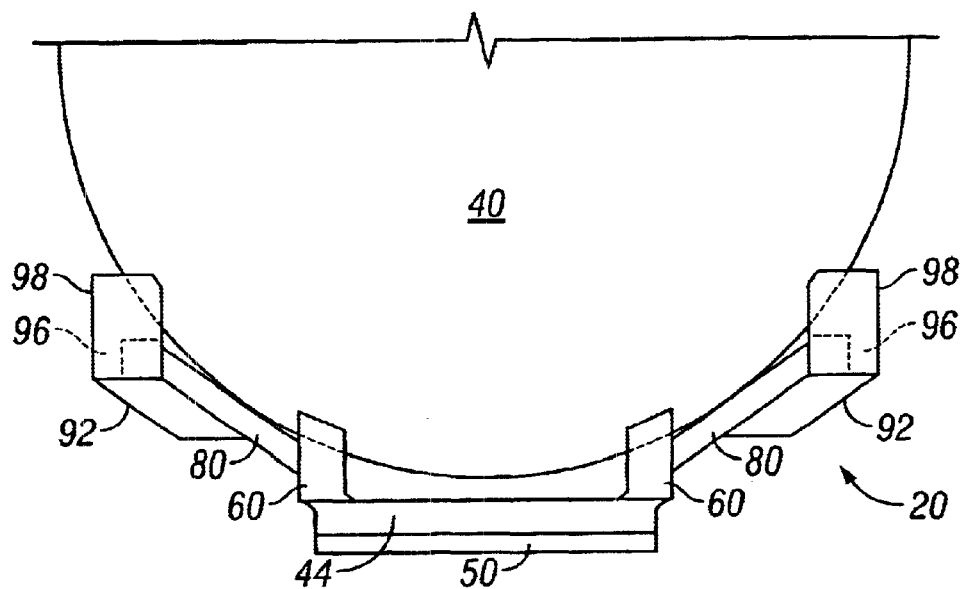
FIG. 3 is a front elevational view of the boat depicted in FIG. 2, having a wafer disposed therewithin.
Figure 4:
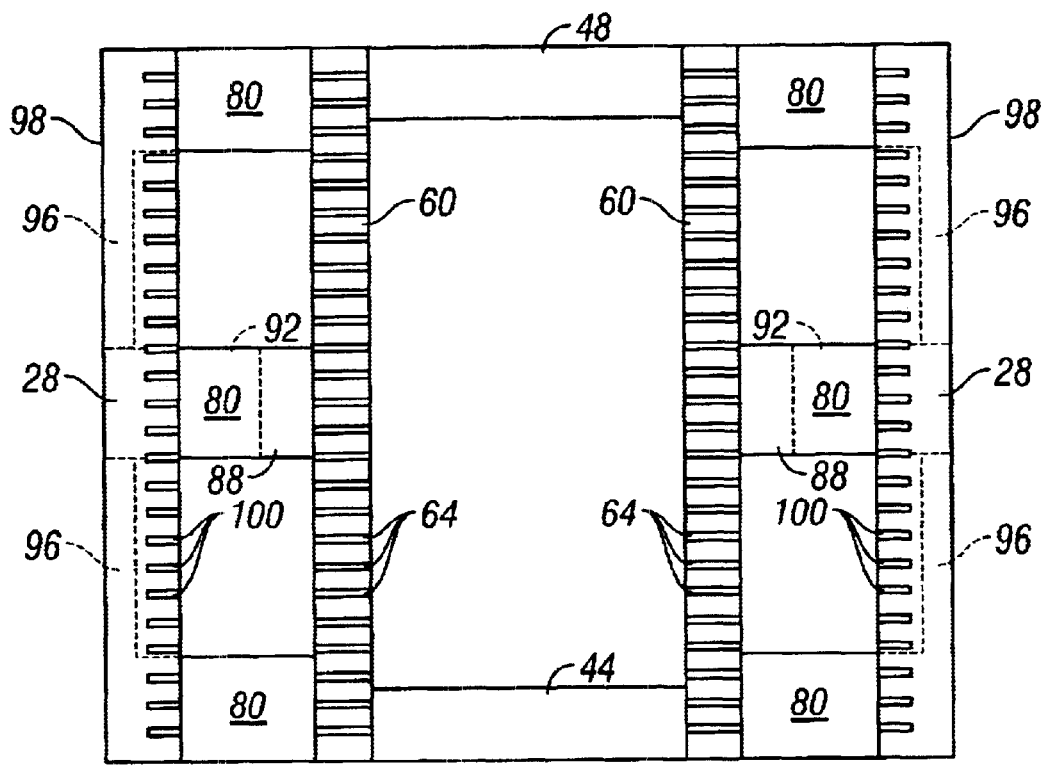
FIG. 4 is a top plan view of the boat.
Figure 5:
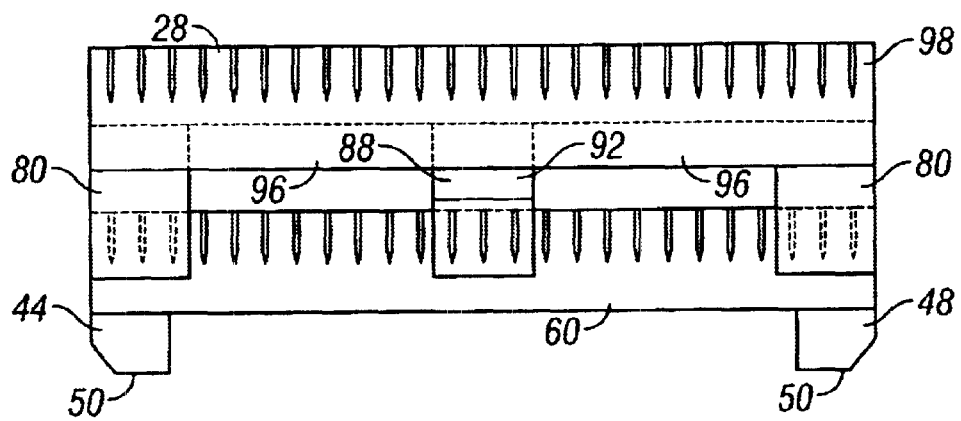
FIG. 5 is a side elevational view of the boat.

Referring now to the boat 20, a perspective view of the boat 20 is presented in FIG. 2, a front elevational view of the boat 20 including a wafer 40 disposed therewithin is depicted in FIG. 3, a top plan view of the boat 20 is depicted in FIG. 4 and a side elevational view of the boat 20 is depicted in FIG. 5. As depicted in FIGS. 2, 3, 4 and 5, the boat 20 is formed with a frontward base member 44 and a rearward base member 48, each having a flat lower surface 50 upon which the boat rests. Two bottom wafer support rails 60 are engaged to the ends of the base members 44 to form a generally rectangular structure, and the bottom wafer support rails 60 include a plurality of wafer engagement slots 64 for the engagement and support of wafers therewithin. As is best seen in FIG. 3, the bottom wafer support rails 60 project upwardly from the base members 44 to hold the bottom edge 72 of the wafers 40 above the surface upon which the boat rests.

Two or more side rail support arms 80 project outwardly and upwardly from the bottom rails 60 to support the side rails 28. In a first preferred embodiment depicted in FIGS. 2, 3, 4 and 5, the boat includes three arms 80 projecting from each bottom rail 60 to support each side rail 28. Significantly, in this embodiment, the central arm 88 is formed with a thickened body portion 92, having a handle cam actuating contact surface 94, that acts as a cam in contacts with the boat rail engagement mechanism 32 of the handle, as is described in detail herebelow. Additionally, each side rail 28 is formed with a relatively thin lip portion 96 which projects downwardly at the outer surface 98 of each side rail 28 between the side rail support arms 80. The lips 96 facilitate the engagement of the boat with the handle, as is described in detail herebelow. The side rails 28 also include a plurality of wafer holding slots 100 that are aligned with the wafer holding slots 64 of the bottom rails 60, to provide lateral support for wafers that are held within the slots of the boat, as is best seen in FIG. 4. The detailed features of the boat handle are next described, such that the locking engagement of the boat and handle can thereafter be presented.

The boat handle 24 is depicted in perspective view in FIG. 6, and FIG. 7 is a side elevational view thereof, FIG. 8 is a top plan view thereof and FIG. 9 is a front elevational view thereof. As depicted in FIGS. 6, 7, 8 and 9, the preferred embodiment of the boat handle 24 includes a manual hand grip 120 that is engaged to a flat metal support bar 128 which supports the boat rail engagement mechanism 32 at its distal end 134. The distal end 134 of the support bar 128 is generally T-shaped, having two laterally projecting engagement mechanism support members 138. While the handle embodiment 24 depicted herein is designed for human handling utilizing the hand grip 120, it is to be understood that the boat rail engagement mechanism 32 can be engaged with a robotic arm or the like (not shown) for automated handling of boats.

The engagement mechanism 32 includes two boat lip holding blocks 150 and a boat rail gripping block 158 that is centrally disposed between the holding blocks 150. Each holding block 150 is engaged to a laterally projecting support member 138 utilizing two engagement screws 162 that pass through smooth bores 166 formed through the holding blocks 150 and are threadably engaged in threaded bores 170 formed through the support members 138. Spacer members 174 are disposed between the holding blocks 150 and the support members 138, and smooth screw bores 178 are formed through the spacer members 174 in alignment with the bores 166 formed through the holding blocks 150, such that the engagement screws 162 can pass therethrough.

The gripping block 158 is pivotally engaged between the holding blocks 150. To accomplish this pivotal engagement, a pivot pin bore 188 is formed laterally through the gripping block, and corresponding pivot pin bores 194 are formed into, but not through, the holding blocks 150. A pivot pin 198 is disposed through the gripping blocks pivot pin bore 194, such that the ends 202 of the pivot pin 198 reside within the holding block pivot pin bores 194. It is therefore to be understood that the gripping block 158 is pivotally engaged with the pivot pin 198, whereas the two holding blocks 150 are fixedly engaged to the support members 138 by the screws 162. The gripping block can therefore rotate rearwardly, as shown by arrow 208 in FIG. 7, and the spacing blocks 174 provide room for the rearward rotation of the gripping block 158. To facilitate the rotational motion of the gripping block, spacing washers 212 (best seen in FIG. 9) are preferably disposed upon the pivot pin between the gripping block and the holding blocks.

As will become clear upon review of this entire specification, particularly FIGS. 14 and 15, it is preferred that the gripping block 150 be orientated in a rearward rotated position when no boat rail is engaged within the engagement mechanism 32. To accomplish the rearward rotation, as is best seen in FIG. 8, a weight block 220 is engaged to the rearward surface 224 of the gripping block 158 utilizing two threaded screws 230 that pass through smooth bores 234 formed through the weight block 220 into threaded bores 240 formed into the rearward surface 224 of the gripping block 158. The weight block 220 provides sufficient mass rearwardly of the pivot pin to cause the gripping block 158 to rotate rearwardly around the pivot pin 198.

Each of the holding blocks 150 includes a base portion 260, a frontward, upwardly projecting ridge 268 and a rearward upwardly projecting stop 272, such that a lip holding slot 278 is formed between the ridge 268 and stop 272. The edges of the ridges 268 and stops 272 are preferably beveled 284, to facilitate the insertion and holding of a boat rail lip 96 therewithin, as is further described herebelow.

The gripping block 158 includes a base portion 300 having a beveled frontward boat arm engagement surface 308, and a rearward, upwardly projecting boat rail gripping head 316 which includes a frontwardly projecting boat rail gripping flange 324 formed at its distal end 328. The rail gripping flange 324 projects frontwardly at an approximately 90° angle 334 from the head 316. In the preferred embodiment, the head 316 projects laterally relative to the base 300 to provide a more stable gripping of the boat rail 28. Having described the detailed features of the various components of the boat rail engagement mechanism 32, the operation of the boat handle 24 in engaging a side rail 28 of a boat 20 is next described with the aid of FIGS. 14, 15 and 16.

FIG. 14 is a side elevational view depicting the boat rail engagement mechanism in its preferred orientation, wherein the boat rail gripping block 158 is rearwardly rotated in its pivotal engagement of the boat lip holding blocks 150. To engage a boat that is sitting on a surface, the handle is maneuvered such that the boat lip holding blocks are brought under the boat rail. In this orientation, as is depicted in FIG. 15, the holding blocks 150 are tipped downwardly such that the ridges 268 are brought beneath the boat rail 28, while the gripping block 158 remains in its rearwardly rotated position. The handle is then maneuvered upwardly 336, such that the boat rail lip 96 is brought within the lip holding slot 278. As the handle is brought upward, the handle cam actuating contact surface 94 of the boat arm 88 makes a camming contact with the boat arm engagement surface 308 of the gripping block 158. Continued upward movement of the handle then results in the lip 96 moving downwardly into the lip holding slot 278, while the gripping block 158 is caused to rotate forwardly due to the downward motion of the handle cam actuating contact surface 94 relative to the arm engagement surface 308. The dimensions of the gripping block 158, and particularly the arm engagement surface 308, gripping head 316 and gripping flange 324, relative to the dimensions of the boat rail 28 are such that the gripping flange 324 rotates forwardly and over the top surface 340 of the boat rail, and FIG. 16 depicts the completed engagement of the boat rail 28 within the handle.

As depicted in FIG. 16 in a completed engagement, the lip 96 of the boat rail is fully inserted into the lip holding slot 278. The lower portions 337 of the lip 96 make contact with the inner surfaces 338 of the lip holding slot 278. Simultaneously, the upper surface 340 of the rail is contacted and held by the lower surface 344 of the gripping flange 324. In this manner, the boat rail is frictionally engaged within the handle, and FIG. 1 provides a perspective view depicting the engagement of the boat rail with the handle. Because the center of gravity of the boat is away from the rail, the top surface 340 of the boat rail 28 is urged to maintain contact with the gripping flange 324 of the gripping block 158, and the boat and handle maintain their engagement. Thereafter, when the boat is set down, such as onto a paddle device, the boat becomes supported from beneath by its base members 44 and 48. As the handle is lowered further, the top surface 340 of the boat rail ceases making contact with the gripping flange 324, whereupon the gripping block 158 pivots rearwardly. Following the rearward rotation of the gripping block, the handle can be further lowered, such that the lip 96 of the boat rail is removed from the lip holding slot 278, whereupon the handle is completely disengaged from the boat. It is therefore to be understood that the handle and boat, particularly the boat rail and the thickened arm body portion 92 of the boat arm 88, with its handle cam actuating contact surface 94, are dimensionally related such that the automatic, secure gripping relationship of the handle and the boat rail is achieved.

All handle components in direct contact with the process boats are preferably made of high quality Vespel™—a high temperature plastic that is extremely resistant to heat and excessive wear. The handle 24 is made of electro-polished 316 stainless steel which provides a strong rigid support for the boat. The handle can easily support the weight of fifty 150 mm silicon wafers with essentially no deflection. The design provides a handle that is highly maneuverable in the clean room and light weight for easy storage.

The handle's grip is ergonomically designed to ensure a firm grip while reducing the risk of carpal-tunnel syndrome. The grip is preferably fabricated in four different colors (grey, red, white, and blue) to help operators to differentiate between process types or other system restrictions. Grey is most typically used for LPCVD processes, while the other colors are generally used for Doped, Oxide, and Metal processes.

FIG. 17 is a broken perspective view depicting an alternative embodiment of the present invention including an alternative boat design that is held by an alternative handle design. As depicted in FIG. 17, the boat 360 includes two base members 364, two bottom wafer support rails 368 (one of which is shown in FIG. 17), and two side rails 372 (one of which is shown in FIG. 17). Two support arms 376 are engaged to a base member 364 and project upwardly and outwardly to support each said rail 372. The bottom rail and the side rail each include a plurality of wafer holding slots 380. Significantly, each of the arms 376 includes a thickened body portion 384 having a handle cam actuating contact surface 386 that is similar to the thickened body portion 92 of the central arm 88 of the boat embodiment 20, with its handle cam actuating contact surface 94, that is described in detail hereabove.

The handle 362 is designed to engage the boat 360 in a manner similar to that described hereabove between handle 24 and boat 20. Specifically, the handle 362 includes a flat metal support bar 396 that may include a hand grip (not shown) similar to the hand grip 120 of the handle 24. The handle 362 further includes a single, centrally located boat lip holding block 400 that is similar to the holding blocks 150 of handle 24, and the holding block 400 is fixedly engaged to the support bar 128 utilizing engagement screws 404. The handle 362 further includes two gripping blocks 412, each of which includes a boat rail gripping head 420 that includes a forwardly projecting boat rail gripping flange 428. Each of the gripping blocks 412 is rotatably engaged upon a pivot pin (not shown) that is similar to the pivot pin engagement described hereabove. It is therefore to be understood that the holding block 400 is fixedly engaged to the handle support 396, whereas the gripping blocks are rotatably engaged to a pivot pin, and therefore are rotatable relative to the fixed holding block. The relationship between the holding block 400 and the gripping blocks 412 is therefore similar to that described in detail hereabove with regard to handle 24.

The holding block 400 further includes a boat lip holding slot (not shown) similar to the lip holding slot 278 of handle 24, and the side rail 372 of the boat 360 is formed with a downwardly projecting lip (not shown) that is similar to the lip 96 of the boat 20. Each gripping block 412 is formed with a beveled frontward boat arm engagement surface 440 that is similar to the boat arm engagement surface 308 of the gripping block 158 of the handle 24, and the engagement surface 440 is adapted to make contact with the handle cam actuating contact surface 386 of a boat arm 376.

The engagement of the boat rail 372 within the handle 362 is similar to that described hereabove. Briefly, each gripping block 412 is initially disposed in a rearwardly rotated orientation, as depicted in FIG. 14. To engage a boat 360 that is sitting on a surface, the handle is maneuvered such that the holding block 400 is brought under the boat rail 372, such that the boat rail lip resides within the holding block slot. The handle cam actuating contact surface 386 makes contact with the engagement surface 440 to cause each gripping block 412 to rotate forwardly, such that the flange 428 of each gripping block 412 rotates forwardly over the top surface of the rail 372. When the handle 362 is moved further upwardly, the rail becomes frictionally engaged within the handle 362. It is therefore to be understood that the boat rail engagement mechanism of the handle 362 functions similarly to that of handle 24 described in detail hereabove.

While the present invention has been shown and described with regard to certain preferred embodiments, it will be understood that those skilled in the art will develop certain alternations and modifications in form and detail upon reading this disclosure. It is therefore intended that the following claims cover all such alterations and modifications that nevertheless include the true spirit and scope of the invention.

What I claim is:

1. A wafer boat, comprising:
   a base being adapted for holding a plurality of wafers;
   at least one rail member being engaged with said base and adapted for supporting a plurality of wafers, said rail member being further adapted for supporting said boat when said rail is engaged by a boat handle;
   said rail member having at least one lip portion being adapted for mating engagement within said boat handle; and said boat also including a handle cam actuating contact surface being adapted for contacting portions of said boat handle and causing said handle to grip said rail member; and wherein said rail member is supported by arm members that project upwardly and outwardly from said base, and wherein said handle cam actuating contact surface is formed on portions of at least one of said arm members, and wherein said handle cam actuating contact surface is adapted to cause a gripping member portion of said handle to rotate such that a flange portion of said gripping member rotates over said rail member to frictionally grip said rail; and said boat being fabricated from quartz.

2. The wafer boat as described in claim wherein said lip portion is disposed at an outer surface of said rail and projects downwardly from portions of said rail member.

3. A wafer disk handling apparatus, comprising:

a wafer boat for holding at least one wafer disk;

a handle for gripping and moving said wafer boat;

said wafer boat including:
  a base being adapted for holding a plurality of wafers;
  at least one rail member being engaged with said base and adapted for supporting a plurality of wafers, said rail member being further adapted for supporting said boat when said rail is engaged by a boat handle;
  said rail having at least one lip portion being adapted for mating engagement within said boat handle; and
  said boat also including a handle cam actuating contact surface being adapted for contacting portions of said boat handle and causing said handle to grip said rail;

said handle including:
  at least one boat rail holding member having a slot formed therein for receiving a portion of a boat rail therewithin;
  at least one boat rail gripping member having a boat rail gripping flange, said gripping member being rotatably engaged relative to said holding member;
  said flange being adapted to make frictional contact with a portion of said boat rail when said boat rail is engaged within said slot; and
  said gripping member including a cam surface disposed away from said flange, said cam surface being adapted to make frictional contact with said handle cam actuating contact surface of said boat to cause said gripping member to rotate relative to said holding member.

4. The wafer disk handling apparatus as described in claim 3 wherein said rail members are supported by an arm members that project upwardly and outwardly from said base, and wherein said handle cam actuating contact surface is formed on portions of at least one of said arm members.

5. The wafer disk handling apparatus as described in claim 4 wherein said lip portion is disposed at an outer surface of said rail and projects downwardly from portions of said rail.

6. The wafer disk handling apparatus as described in claims 3 including two said holding members and one said gripping member.

7. The wafer disk handling apparatus as described in claim 3 including two said gripping members and one said holding member.

8. The wafer disk handling apparatus as described in claim 3 wherein said gripping member is nominally positioned in an open orientation, and wherein said contact of said cam surface with said handle cam actuating contact surface of said boat causes said gripping member to rotate to a boat rail gripping position.

9. The wafer disk handling apparatus as described in claim 8 wherein said contact between said cam surface and said handle cam actuating contact surface of said boat is caused by an upward motion of said gripping member relative to said boat rail.

10. The wafer disk handling apparatus as described in claim 9 wherein a downward motion of said gripping member relative to said boat rail causes said cam surface to cease contact with said handle cam actuating contact surface of said boat, whereupon said gripping member rotates away from said boat rail to release said boat rail from frictional contact with said flange.

* * * * *